United States Patent
Krueger et al.

(10) Patent No.: US 9,488,830 B2
(45) Date of Patent: Nov. 8, 2016

(54) SCANNING DEVICE

(71) Applicant: JENOPTIK Optical Systems GmbH, Jena (DE)

(72) Inventors: Ullrich Krueger, Milda (DE); Thomas Dressler, Jena (DE); Stefan Heinemann, Jena (DE)

(73) Assignee: JENOPTIK Optical Systems GmbH, Jena (DE)

( * ) Notice: Subject to any disclaimer, the term of this patent is extended or adjusted under 35 U.S.C. 154(b) by 0 days.

(21) Appl. No.: 14/898,680

(22) PCT Filed: Jun. 20, 2014

(86) PCT No.: PCT/DE2014/100204
§ 371 (c)(1),
(2) Date: Dec. 15, 2015

(87) PCT Pub. No.: WO2014/202057
PCT Pub. Date: Dec. 24, 2014

(65) Prior Publication Data
US 2016/0131897 A1 May 12, 2016

(30) Foreign Application Priority Data

Jun. 21, 2013 (DE) .................. 10 2013 106 533

(51) Int. Cl.
*G02B 26/08* (2006.01)
*G02B 26/12* (2006.01)
*G03F 7/20* (2006.01)
*G02B 27/00* (2006.01)

(52) U.S. Cl.
CPC ........... *G02B 26/126* (2013.01); *G02B 26/124* (2013.01); *G02B 27/0031* (2013.01); *G03F 7/704* (2013.01)

(58) Field of Classification Search
CPC G02B 26/124; G02B 26/125; G02B 26/126; G02B 27/0031; G02B 12/0005; G03F 7/704
USPC ..................... 359/216.1–219.2, 205.1–208.2; 347/243–244, 258–260
See application file for complete search history.

(56) References Cited

U.S. PATENT DOCUMENTS 4,116,566 A  9/1978  Sick
6,239,894 B1  5/2001  Ishibe
(Continued)

FOREIGN PATENT DOCUMENTS

DE  25 50 814 A1  5/1977
WO  WO 99/03012  1/1999

*Primary Examiner* — James Phan
(74) *Attorney, Agent, or Firm* — Duane Morris LLP

(57) ABSTRACT

A scanning device includes a scan unit with a polygon mirror, pre-scan optics and post-scan optics. The pre-scan optics are arranged upstream of the polygon mirror in such a way that a beam bundle coming from the light source impinges on the polygon mirror at an angle of incidence ($\alpha$) in a cross scan plane, and the optical axis of the post-scan optics is arranged in a reflection direction of the polygon mirror. Distortions, trapezoidal distortion and scan bow, occurring when imaging the light source on a scan line are minimized in that the cylindrical mirror of the post-scan optics is tilted at a first tilt angle ($\beta$) relative to the surface normals to the polygon mirror in the cross scan plane, and one of the two corrective lenses of the post-scan optics is tilted relative to the optical axis of the post-scan optics at a second tilt angle ($\gamma$) and is arranged so as to be offset by a distance.

4 Claims, 2 Drawing Sheets

(56) References Cited

U.S. PATENT DOCUMENTS

| | | | |
|---|---|---|---|
| 6,400,488 B1* | 6/2002 | Nagasaka | G02B 26/121 359/212.1 |
| 2007/0041070 A1 | 2/2007 | Ishibe et al. | |
| 2011/0134501 A1* | 6/2011 | Motoyama | G02B 26/127 359/216.1 |
| 2012/0002261 A1 | 1/2012 | Yukawa et al. | |

* cited by examiner

SCANNING DEVICE

RELATED APPLICATIONS

The present application is a U.S. National Stage application of International PCT Application No. PCT/DE2014/100204 filed on Jun. 20, 2014 which claims priority benefit of German Application No. DE 10 2013 106 533.3 filed on Jun. 21, 2013, the contents of each are incorporated by reference in their entirety.

FIELD OF THE INVENTION

The invention is directed to a scanning device with anamorphic, catadioptric post-scan optics such as is known generically from WO 99/03012 A1.

BACKGROUND OF THE INVENTION

Scanning devices are used, for example, for direct exposure of printed circuit boards, where they scan a light bundle over a plane target surface along a scan line in a scan direction, while the target surface is moved in a forward feed direction running perpendicular to the scan direction. A generic scanning device such as that disclosed in WO 99/03012 A1 includes a light source, a scan unit, optics arranged upstream of the scan unit (pre-scan optics) to shape and guide a bundle of beams coming from the light source to the scan unit, and optics which are arranged downstream of the scan unit (post-scan optics) to shape and guide the beam bundle deflected by the scan unit onto a target surface.

According to an embodiment example of the above-cited WO 99/03012 A1, the pre-scan optics include a cylindrical mirror and a bicylindrical, refractive element and image the light source into the post-scan optics so as to provide the anamorphic characteristics of the beam bundle required by the post-scan optics. A deflecting mirror, which is arranged upstream of the scanning device, and an input mirror merely serve to deflect the beam, or to deflect and couple the beam into the scanning device, formed by a polygon mirror, at an input angle in the cross scan plane (under a sagittal input angle in the cited reference) formed by the beam axis of the beam bundle and the surface normal to the polygon mirror facets of the polygon mirror.

The polygon mirror facets reflect the beam bundle in the cross scan plane at an angle of reflection equal to the angle of incidence into the post-scan optics.

The post-scan optics are an F-theta objective in which there can occur various types of distortion which it is necessary to minimize. This distortion includes scan bow and trapezoidal distortion.

Scan bow is a curvature of the scan line relative to the scan plane which occurs in every F-theta objective and which increases with increasing distance of the image location from the optical axis of the post-scan optics.

Trapezoidal distortion is known in projector arrangements when the image is to be projected at various heights on a projection surface. The image is then typically wider at the upper edge of the image than at the lower edge of the image. This type of distortion arises when the object and/or the image are/is not arranged perpendicular to the optical axis of the projection objective. In an F-theta objective, the input angle and possibly a centered arrangement of the post-scan optics with respect to the input angle are determining factors in this respect.

Therefore, it is suggested for both arrangements of a scanning device according to the above-cited WO 99/03012 A1 that the post-scan optics downstream of the polygon mirror be arranged so as to be centered with respect to the polygon mirror, i.e., that the optical axis of the post-scan optics be perpendicular to the rotational axis of the polygon mirror so that the beam bundle reflected by the polygon mirror enters the post-scan optics at an angle to the optical axis of the post-scan optics equal to the angle of incidence and is imaged on the target object in an image point which lies in a plane including the optical axis. A centered arrangement of the post-scan optics with respect to the polygon is the arrangement having the least distortion. At the same time, however, it results in a fairly bulky construction in case of larger incident angles of the incident beam bundle.

According to one construction, the post-scan optics include, arranged in beam direction, a spherical meniscus and a plane cylindrical lens, which together form a doublet, and a spherical cylindrical lens. Comparable to the corrective objective of a scanning device according to the invention, the three optical elements mentioned above have the object of eliminating or minimizing the image aberrations that cannot be compensated by the subsequent mirror arrangement for generating a telecentric beam path. The subsequent mirror arrangement includes a first spherical mirror and a second spherical mirror and reflects the beam bundle via a spherical cylindrical lens into the focal plane of the post-scan optics comprising all of the elements mentioned above.

A scanning device according to the above-cited WO 99/03012 A1 is unsuitable especially for large scan lengths (i.e., generally, a long focal length of the post-scan optics in scan direction). A particular disadvantage consists in the large constructional size of the mirror arrangement owing to the first spherical mirror which has approximately twice the length of the scan line to be generated.

SUMMARY OF THE INVENTION

It is the object of the invention to find a scanning device for large scan lines with the fewest possible optical component parts which, in turn, have the smallest possible constructional size resulting in savings on space, weight and cost. Further, the optical component parts must be simple to produce.

This object is met for a scanning device for imaging a beam bundle along a scan line comprising a light source, a scan unit with a polygon mirror and pre-scan optics upstream of the polygon mirror and post-scan optics downstream of the polygon mirror. The pre-scan optics are arranged upstream of the polygon mirror in such a way that the beam bundle impinges on the polygon mirror at an angle of incidence in a cross scan plane.

It is key to the invention that the optical axis of the post-scan optics is arranged in the reflection direction of the polygon mirror. The post-scan optics comprise successively in direction of the axis beam a corrective objective with at least a first corrective lens and a second corrective lens and only one cylindrical mirror and a cylindrical lens.

The cylindrical mirror is tilted at a first tilt angle relative to the surface normal to the polygon mirror in the cross scan plane, and the first tilt angle $\beta$ is determined by the angle of incidence $\alpha$. One of the two corrective lenses is tilted relative to the optical axis of the post-scan optics at a second tilt angle $\gamma$ and is arranged so as to be offset by a distance a.

The first tilt angle $\beta$ is advantageously in the range of $0.97\alpha < \beta < 1.03\alpha$.

In order to satisfy the telecentricity conditions for the post-scan optics with only one cylindrical lens 4.3, the object-side focal point of the cylindrical mirror is arranged within the polygon mirror near the reflecting polygon mirror facet; and the cylindrical mirror has a focusing effect in the scan plane, a plane arranged perpendicular to the cross scan direction.

It is advantageous when the beam bundle is shaped in a weakly convergent or divergent manner through one of the two corrective lenses so that the natural image field curvature of the cylindrical mirror is partially compensated and the distance between the cylindrical mirror and the scan line is kept short.

BRIEF DESCRIPTION OF THE DRAWINGS

The scanning device will be described more fully with reference to the following drawings, in which.

DESCRIPTION OF THE EMBODIMENTS

Figure 1:
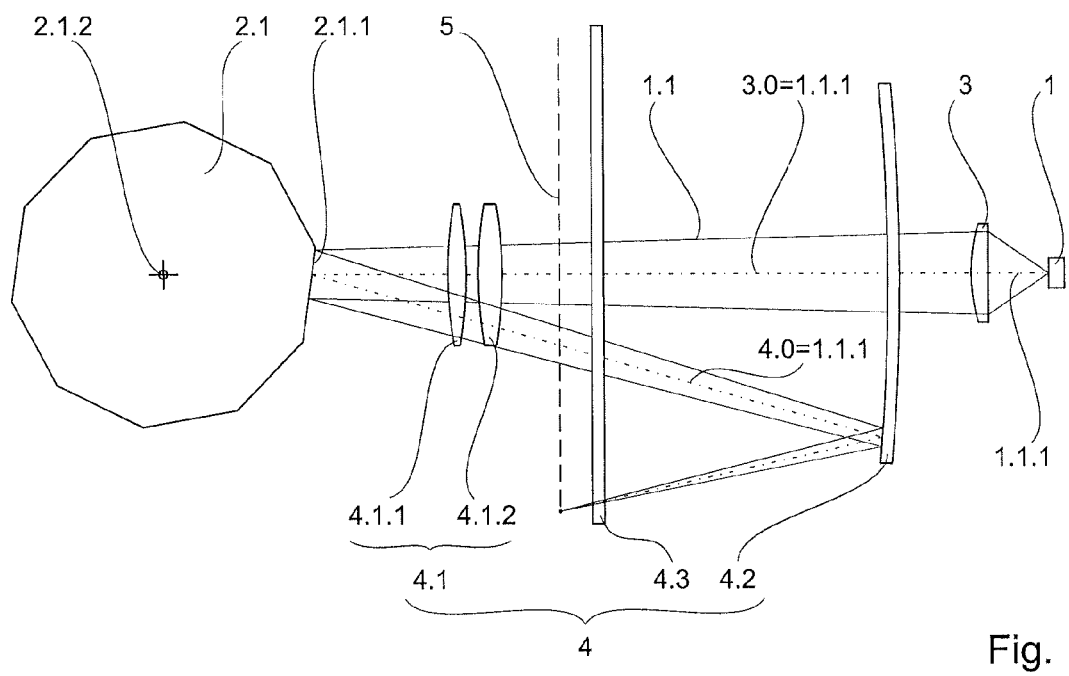
FIG. 1 is an optical schematic of a scanning device in a top view perpendicular to the rotational plane of the polygon mirror.

Similar to the scanning device described in the prior art, a scanning device according to the invention includes a light source 1 which emits a beam bundle 1.1 with an axis beam 1.1.1, a scan unit 2 with a polygon mirror 2.1, pre-scan optics 3 upstream of the polygon mirror 2.1 in direction of the axis beam 1.1.1, and post-scan optics 4 downstream of the polygon mirror 2.1 in direction of the axis beam 1.1.1.

The polygon mirror 2.1 is rotatable around a rotational axis 2.1.2 and has a plurality of polygon mirror facets 2.1.1 with surface normals subtending a rotational plane of the polygon mirror 2.1 perpendicular to the rotational axis 2.1.2.

Figure 2:
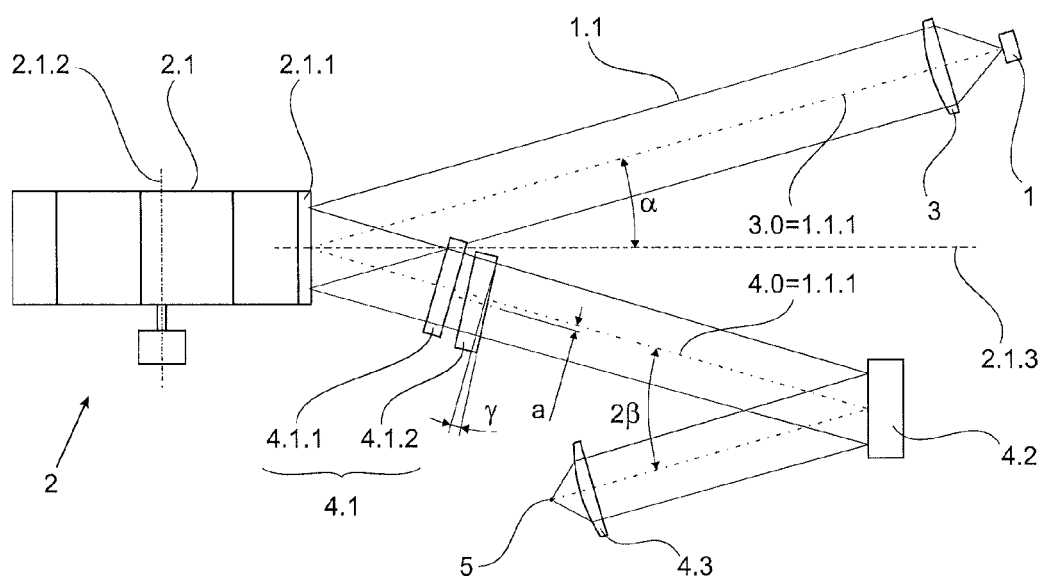
FIG. 2 is a side view of the optical schematic shown in FIG. 1.

By cross scan plane is meant a plane which includes the optical axis of the pre-scan optics 3 and the rotational axis 2.1.2 of the polygon mirror 2.1. It accordingly lies above the rotational plane 2.1.3 in the drawing plane and below the rotational plane 2.1.3 below the drawing plane in the optical schematic shown in FIG. 2.

The undeflected polygon mirror position is the position of the polygon mirror 2.1 in which the axis beam reflected by the pre-scan optics 3 into the post-scan optics 4 still lies in the cross scan plane.

The scan plane whose position changes with changing deflection of the beam bundle 1.1 at the rotating polygon mirror 2.1 and at the cylindrical mirror 4.2 is perpendicular to the cross scan plane in each instance and contains the axis beam in the undeflected polygon mirror position.

The imaging characteristics of the post-scan optics 4 are very different in the cross scan plane and in the plane perpendicular thereto resulting in extremely different geometries of the beam bundle 1.1.

In the cross scan plane, the beam bundle 1.1 impinges on a polygon mirror facet 2.1.1 of the polygon mirror 2.1 at an angle of incidence $\alpha$, is reflected at a reflection angle of the same magnitude into the optical axis of the post-scan optics 4 and, therefore, of the downstream corrective objective 4.1, and is imaged with the cylindrical lens 4.3 into the image-side focal plane of the post-scan optics 4 in a point of focus via the cylindrical mirror 4.2 which has no refractive power in this direction. The scan line 5 contains this point of focus with polygon position undeflected and is oriented perpendicular to the cross scan plane.

Because the post-scan optics 4 are arranged relative to the polygon mirror 2.1 such that the beam bundle 1.1 is coupled into the optical axis of the post-scan optics 4, there occur the two types of distortion, trapezoidal distortion and scan bow, described as disadvantageous in the above-cited WO 99/03012 A1.

As will be explained more exactly, these two types of distortion are kept very low according to the invention through a special arrangement of the cylindrical mirror 4.2 and of one of the corrective lenses 4.1.1, 4.1.2 relative to the optical axis of the post-scan optics 4.

The beam bundle 1.1 coming from the light source 1 is substantially expanded perpendicular to the cross scan plane through the pre-scan optics 3 and is shaped and guided in a weakly convergent beam bundle 1.1 such that when impinging on the polygon mirror 2.1 a polygon mirror facet 2.1.1 is illuminated in the center in each instance. It is reflected by the polygon mirror 2.1 in a skewed manner into the post-scan optics 4 and focused through the corrective objective 4.1 and cylindrical mirror 4.2 into the image-side focal plane of the post-scan optics 4.

The post-scan optics 4 comprise a corrective objective 4.1 with at least a first corrective lens 4.1.1 and a second corrective lens 4.1.2, a cylindrical mirror 4.2 and a cylindrical lens 4.3 successively in direction of the axis beam 1.1.1.

Compared to post-scan optics in the above-cited WO 99/03012 A1, post-scan optics 4 according to the invention are conceived and calculated such that they make do with only one cylindrical mirror 4.2, and the corrective lenses 4.1.1, 4.1.2 and especially the cylindrical mirror 4.2 can be produced so as to be comparatively smaller and simpler. It is generally advantageous when corrective lenses that are provided are constructed so as to be strip-shaped, particularly for large scan lengths, e.g., greater than 300 mm and with a large focal length of post-scan optics resulting from this greater length.

Due to the fact that, according to the invention, the post-scan optics 4 are arranged so as to be centered with respect to the beam bundle 1.1 reflected by the polygon mirror 2.1 and, therefore, coaxial to the direction in which the beam bundle 1.1 is coupled into the post-scan optics 4, strip heights for the corrective lenses 4.1.1, 4.1.2 are comparatively lower assuming that strip-shaped corrective lenses are generally produced such that they physically encompass the region around their optical axis in order to achieve a high quality.

The scan bow occurring as a result of this arrangement and the image-side telecentricity in the cross scan plane are minimized in that the cylindrical mirror 4.2 is tilted in the cross scan plane at the first tilt angle $\beta$ so as to be adapted to the angle of incidence $\alpha$. The setting of a tilt angle $\beta$ in the range of $0.97\alpha < \beta < 1.03\alpha$ sufficiently minimizes the scan bow and the deviation from telecentricity.

The remaining trapezoidal distortion is reduced in that the first corrective lens 4.1.1 or second corrective lens 4.1.2 is offset at a distance a and tilted at a second tilt angle $\gamma$ in the cross scan plane with respect to the optical axis of the post-scan optics 4. The corrective lens of the two corrective lenses 4.1.1, 4.1.2 having the greatest refractive power is best suited for this purpose. The offset by distance a and the tilt at second tilt angle $\gamma$ are adapted to one another in such a way that the trapezoidal distortion is sufficiently low and the influence on all of the other imaging parameters, e.g., the imaging quality, is only minimal.

Therefore, the pre-scan optics 3 can be arranged above the post-scan optics 4 at only a small input angle $\alpha$ considered in cross scan plane so that the coupling in of the beam bundle 1.1 through the corrective objective 4.1 is likewise facilitated through the smaller strip height of the first corrective lens 4.1.1 and second corrective lens 4.1.2. Accordingly, a deflection element in the vicinity of the polygon mirror 2.1 can be omitted, which results in a distinct improvement in the stability of the arrangement.

The aim of the pre-scan optics 3 is to image the light source 1 into the post-scan optics 4 so as to provide the anamorphic characteristics of the beam bundle 1.1 that are required by the post-scan optics 4. Corresponding to the prior art, the pre-scan optics 3 have a focus in the cross scan plane as near as possible to the polygon mirror 2.1 so that any wobble error is minimized.

In the plane perpendicular thereto, a weakly convergent beam bundle 1.1 is adapted to the natural image field curvature of the post-scan optics 4. The light source 1 is imaged in such a way that the image-side aperture required for this purpose occurs on the scan line 5.

The primary function of the post-scan optics 4 is realized through the cylindrical mirror 4.2 acting in the scan plane and the cylindrical lens 4.3 acting in the cross scan plane. To fulfill the telecentricity conditions, the object-side focal point of the cylindrical mirror 4.3 is arranged within the polygon mirror 2.1 near the reflecting polygon mirror facet 2.1.1. At the same time, the cylindrical mirror 4.3 has a focusing effect in the scan plane so that a collimated beam bundle 1.1 would be imaged in focus in the image-side focal point of the post-scan optics 4. Through the formation of a (weakly) convergent or divergent beam bundle 1.1, the natural image field curvature of the cylindrical mirror 4.2 can be partially compensated.

However, this is only sufficient for low image-side numerical apertures. For a scanning device with a scan length of approximately 600 mm and a polygon mirror 2.1 with fifteen polygon mirror facets 2.1.1, the image field curvature is also too great in this case upward of an image-side numerical aperture of 0.012, which is compensated by the corrective lens 4.1.1, 4.1.2 of the two corrective lenses 4.1.1, 4.1.2 which has an appreciably lower refractive power than the cylindrical mirror 4.2.

The coma increases significantly toward the scan edge for the same scan direction with an image-side numerical aperture >0.015, which is compensated by the other of the two corrective lenses 4.1.1, 4.1.2, a virtually concentric meniscus lens.

The two corrective lenses 4.1.1, 4.1.2 are arranged near the polygon mirror 2.1, which is conducive for a small constructional size of the scanning device.

For applications with a broad-band light source 1, the spectral effect of the corrective objective 4.1 must be minimized, where required, through a suitable selection of material for the two corrective lenses 4.1.1, 4.1.2 or an additional, third corrective lens 4.1.3 must be used for achromatization.

The imaging in the cross scan plane is influenced very little by the corrective objective 4.1 and the cylindrical mirror 4.2. The focusing of the image of the light source 1 generated in the vicinity of the polygon mirror 2.1 through the pre-scan optics 3 is effected out by means of the spherical cylindrical lens 4.3. This cylindrical lens 4.3 will generate spherical aberrations and longitudinal chromatic aberrations with a sufficiently large image-side numerical aperture. Both aberrations are virtually constant along the length of the scan line 5 and can therefore be canceled by the pre-scan optics 3.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

LIST OF REFERENCE CHARACTERS

1 light source
1.1 beam bundle
1.1.1 axis beam
2 scan unit
2.1 polygon mirror
2.1.1 polygon mirror facet
2.1.2 rotational axis of the polygon mirror
2.1.3 rotational plane of the polygon mirror
3 pre-scan optics
3.0 optical axis of the pre-scan optics
4 post-scan optics
4.0 optical axis of the post-scan optics
4.1 corrective objective
4.1.1 first corrective lens
4.1.2 second corrective lens
4.2 cylindrical mirror
4.3 cylindrical lens
5 scan line
$\alpha$ angle of incidence
$\beta$ first tilt angle
$\gamma$ second tilt angle
a distance

What is claimed is:

1. Scanning device for imaging a beam bundle along a scan line comprising a light source which emits the beam bundle with an axis beam, a scan unit having a polygon mirror and pre-scan optics upstream of the polygon mirror in direction of the axis beam and post-scan optics downstream of the polygon mirror in direction of the axis beam, with an optical axis, wherein the pre-scan optics are arranged upstream of the polygon mirror in such a way that the beam bundle impinges on the polygon mirror at an angle of incidence ($\alpha$) in a cross scan plane, characterized in that the optical axis of the post-scan optics is arranged in reflection direction of the polygon mirror, the post-scan optics comprise successively in direction of the axis beam a corrective objective with at least a first corrective lens and a second corrective lens, only one cylindrical mirror and a cylindrical lens, the cylindrical mirror is tilted at a first tilt angle ($\beta$) relative to the surface normals to the polygon mirror in the cross scan plane, which first tilt angle ($\beta$) is determined by the angle of incidence ($\alpha$), and one of the two corrective lenses is tilted relative to the optical axis of the post-scan optics at a second tilt angle ($\gamma$) and is arranged so as to be offset by a distance.

2. Scanning device according to claim 1, wherein said first tilt angle ($\beta$) is in the range of $0.97\alpha < \beta < 1.03\alpha$.

3. Scanning device according to claim 1, wherein said object-side focal point of the cylindrical mirror is arranged within the polygon mirror near the reflecting polygon mirror facet, and the cylindrical mirror has a focusing effect in the scan plane, a plane arranged perpendicular to the cross scan direction, so that the telecentricity conditions are met with only one cylindrical lens.

4. Scanning device according to claim 1, wherein said beam bundle is shaped in a weakly convergent or divergent manner through one of the two corrective lenses so that the natural image field curvature of the cylindrical mirror is partially compensated and the distance between the cylindrical mirror and the scan line is kept short.

\* \* \* \* \*